United States Patent [19]

Doehler et al.

[11] Patent Number: 4,626,447
[45] Date of Patent: Dec. 2, 1986

[54] PLASMA CONFINING APPARATUS

[75] Inventors: Joachim Doehler, Union Lake; Masatsugu Izu, Birmingham, both of Mich.

[73] Assignee: Energy Conversion Devices, Inc., Troy, Mich.

[21] Appl. No.: 713,354

[22] Filed: Mar. 18, 1985

[51] Int. Cl.$^4$ ............................................. C23C 13/08
[52] U.S. Cl. ...................................... 427/39; 118/718; 118/720; 118/723; 118/50.1
[58] Field of Search .............. 118/723, 718, 720, 50.1; 427/38, 39

[56] References Cited

U.S. PATENT DOCUMENTS

| 4,479,455 | 10/1984 | Doehler et al. | 118/718 |
| 4,511,593 | 4/1985 | Brandolf | 427/37 |
| 4,512,283 | 4/1985 | Bonifield et al. | 118/723 |

Primary Examiner—Richard Bueker
Attorney, Agent, or Firm—Ronald W. Citkowski; Marvin S. Siskind

[57] ABSTRACT

Apparatus for and a method of confining the ionized plasma developed during the glow discharge deposition of thin film semiconductor alloy material to preselected portions of the plasma region so as to prevent etching and deposit only uniform, nonhomogeneous semiconductor alloy material.

11 Claims, 7 Drawing Figures

PLASMA CONFINING APPARATUS

FIELD OF THE INVENTION

This invention relates generally to apparatus for and a method of producing improved semiconductor structures and more particularly to plasma confining apparatus adapted to substantially prevent both the glow discharge deposition of nonuniform, nonhomogeneous semiconductor alloy material and the removal of previously deposited uniform and homogeneous semiconductor alloy material. The invention operates by confining the glow discharge plasma to preselected portions of a plasma region developed between the substrate and the cathode of a vapor deposition chamber.

BACKGROUND OF THE INVENTION

This invention relates to a method of and apparatus for continuously producing semiconductor devices on a substrate by depositing successive layers of semiconductor alloy material in a plurality of operatively interconnected glow discharge deposition chambers. The composition of each layer of semiconductor alloy material is dependent upon, inter alia, (1) the particular precursor mixture of process gases introduced into each of the deposition chambers, (2) the method of forming the semiconductor alloy materials from those process gases, (3) the length of time those process gases are subjected to the electromagnetic field utilized to decompose said gases, and (4) the strength and uniformity of that electromagnetic field. More particularly, (1) the precursor mixture of process gases introduced into the first deposition chamber is carefully controlled and isolated from the precursor mixture of process gases introduced into adjacent deposition chambers; (2) the electromagnetic field is maintained at a constant, uniform strength over the entire length of the cathode; (3) the mixture of process gases flowing through the plasma region is prevented from being depleted along its path of travel; and (4) areas of stagnation are removed from the path of travel of those process gases through the plasma region of the deposition chamber. In this manner, homogeneous layers of semiconductor alloy material may be successively deposited onto a large area substrate in each one of the deposition chambers. If each individual one of the layers of semiconductor alloy material is not uniformly and homogeneously deposited, the overall efficiency of the semiconductor device produced as a conglomeration of those layers suffers. It therefore becomes necessary to carefully control all processing steps which bear on the uniformity, homogeneity and general quality of the deposited semiconductor alloy material.

In the glow discharge deposition of semiconductor alloy material onto a substrate, the discrete mixtures of process gases introduced into each of the dedicated deposition chambers is directed to flow between a large area cathode plate and the electrically conductive, large area substrate spaced thereabove. It is in this area, bounded by the cathode and substrate, and referred to hereinafter as the plasma region, that a.c. or d.c. energy coupled to the cathode, develops an electromagnetic field which operates to disassociate the mixture of precursor process gases into activated species which are then deposited onto the substrate. If the electromagnetic field is not uniform over the entire length and width of the cathode, the properties of the semiconductor alloy material depositing onto the substrate will be accordingly affected. More particularly, nonuniform power densities of electromagnetic energy created in discrete portions of the plasma region result in the deposition of layers of nonuniform and nonhomogeneous semiconductor alloy material. Therefore, the deposition of nonuniform, nonhomogeneous, semiconductor alloy material, which nonuniformity and nonhomogeniety is caused by the presence of gradients in the strength of the discrete electromagnetic field established within the single plasma region, must be substantially prevented.

It has been discovered that the uniformity and homogeneity of a layer of semiconductor alloy material deposited onto the substrate at the portions of the plasma region proximate the opposite distal ends of the large area cathode varies from the uniformity and homogeneity of the layer of semiconductor alloy material deposited onto the substrate inward of those end portions (i.e., the central portion of the plasma region). This discovery is disclosed in U.S. patent application Ser. No. 418,859, filed Sept. 16, 1982, which application is assigned to the Assignee of the instant application and the disclosure of which is incorporated herein by reference.

By way of illustration, and referring to the schematic drawing of FIG. 3, Arrow 9 indicates the direction of movement of the grounded web of substrate material 11, which web is spaced above the cathode plate 34 a distance "d" so as to define a plasma region 80 therebetween. It is in this plasma region 80 that a mixture of process gases are disassociated and recombined into activated species. In the exemplary plasma region 80 depicted in FIG. 3, two discrete electromagnetic fields which vary in intensity of electromagnetic energy are illustrated.

The nature of the electromagnetic field generated between the cathode 34 and the substrate 11 determines the reaction kinetics for the glow discharge plasma created therebetween. Accordingly, the properties of the layer of semiconductor alloy material deposited from the mixture of process gases decomposed, recombined and activated in the centrally disposed electromagnetic field labelled "A" are different from the properties of the layer of semiconductor alloy material deposited from the mixture of process gases decomposed, recombined and activated in the distally disposed electromagnetic fields labelled "B". It should therefore be readily apparent that the presence of such nonuniform electromagnetic fields at the distal ends of the plasma region 80 causes serious problems with respect to the deposition of uniform and homogeneous layers of semiconductor alloy material.

Still referring to FIG. 3, note that the electromagnetic field A, disposed centrally within the plasma region, is substantially uniform and homogeneous. However, in comparison thereto, the electromagnetic fields B, disposed at the opposed distal portions of the plasma region are substantially nonuniform and nonhomogeneous. This difference in uniformity and homogeneity of the electromagnetic field is due to the fact that the electromagnetic field A is developed in the central portion of the plasma region, a portion of the plasma region in which the distance between the substrate and the cathode is constant, therefore forming electromagnetic field vectors which are substantially perpendicular to the plane of the substrate. In contrast thereto, electromagnetic fields B are developed at the distal portions of the plasma region, the portions of the plasma region which are adjacent the opposed distal ends of the cathode plate 34 and in which the substrate-cathode distance varies, thereby promoting angled or bent electromagnetic field vectors relative to the plane of the substrate. The result of the nonuniform and nonhomogeneous electromagnetic fields B is the deposition of a layer of semiconductor alloy material which is nonhomogeneous and nonuniform in cross-section onto the surface of a substrate traveling through the plasma region.

FIG. 4 illustrates shielding apparatus disclosed in said previously filed U.S. patent application Ser. No. 418,859, said shielding apparatus adapted to prevent nonhomogeneous, nonuniform semiconductor alloy material produced by the presence of the distally opposed, nonuniform and nonhomogeneous electromagnetic fields B from being deposited onto the surface of the web of substrate material 11. The shielding apparatus includes a pair of substantially identical shielding plates 60, one of which is positioned adjacent each of the opposed distal ends of the cathode plate 34. It should be apparent that, although only a single cathode is shown in the schematic drawing of the depositon chambers of FIG. 2, a plurality of discrete cathode plates may actually be employed in an elongated, single depostion chamber. It is to be understood that in such instances, a shielding plate 60 is to be positioned adjacent each of the opposed distal end of each discrete cathode plate 34.

FIG. 4 illustrates the manner in which the shielding plates 60 function to blanket the web of substrate material 11 in the areas of nonuniform, nonhomogeneous electromagnetic fields B so that the ionized plasma developed from the mixture of process gases flowing through the plasma region is deposited onto the shielding plates 60 rather than onto the web of substrate material 11 which travels therepast in the direction of travel of Arrow 9. In order to best accomplish that web-blanketing function, the shielding plates 60 are positioned in a plane generally parallel to the plane of travel of the web of substrate material 11 but removed downwardly therefrom by a distance of approximately one-quarter ($\frac{1}{4}$) inch (approximately the dark space).

A polyimide film 61 may be applied so as to cover at least that surface of each of the shielding plates 60 which faces the web of substrate material 11. The polyimide film is adapted to prevent a glow discharge plasma from developing in the area between the web of substrate material 11 and the shielding plates 60. The polyimide film may be KAPTON (registered trademark of Dupont Corporation), type 4. Polyimide films were selected because of their inherent properties of high temperature stability, good wear resistance at high temperature and low outgassing in high vacuum. Other films could also be used, if the other films exhibit similar properties.

The shielding plates 60 proved to be substantially effective in preventing the deposition of nonuniform and nonhomogeneous semiconductor alloy material under normal operating conditions of Applicants' glow discharge deposition apparatus. However, Applicants have recently discovered a method of depositing a fluorinated microcrystalline p-doped semiconducor alloy material (said microcrystalline p-doped semiconductor material disclosed in U.S. patent application Ser. No. 667,659 filed Nov. 2, 1984, which application is also assigned to the assignee of the instant application and the disclosure of which is incorporated herein by reference), which method requires, inter alia, a significant increase in the level of r.f. power delivered to the cathode plate 34, and hence, a corresponding increase in the strength of the electromagnetic field and the energy imported to the plasma generated in the plasma region.

Since the terms "amorphous" and "microcrystalline" will appear throughout this specification, it is necessary to provide specfific definitions for these terms. The term "amorphous", as used herein, is defined to include alloys or materials exhibiting long range disorder, although said alloys or materials may exhibit short or intermediate range order or even contain crystalline inclusions. As used herein the term "microcrystalline" is defined as a unique class of said amorphous materials characterized by a volume fraction of crystalline inclusions, said volume fraction of inclusions being greater than a threshold value at which the onset of substantial changes in certain key parameters such as electrical conductivity, band gap and absorption constant occurs. It is to be noted that pursuant to the foregoing definitions, the microcrystalline, p-doped semiconductor alloy material referred to in the instant invention falls within the generic term "amorphous".

Referring now to FIG. 5, the centrally disposed activated plasma of a glow discharge deposition chamber specifically adapted for depositing said fluorinated microcrystalline p-doped semiconductor alloy material is illustrated by the reference character A. Since, in order to deposit the microcrystalline p-doped material the electromagnetic field A must be stronger than the electromagnetic fields utilized to deposit amorphous p-doped semiconductor alloy material, a more energetic plasma is generated from the mixture of process gases introduced into the plasma region of the glow discharge deposition chamber. It has been experimentally determined that this highly energetic plasma tends to creep into the space formed between the horizontally disposed plate 35a of the cathode shields 35, which shields are disposed at each of the opposed distal ends of the plasma region adjacent the web of substrate material 11. The creep of the highly energetic plasma into that space is depicted by the reference characters A'. Not only is the "creeping" plasma A' nonuniform and nonhomogeneous, as compared to the plasma A in the centrally disposed plasma region, but that highly energetic plasma A' has been determined to actually cause the semiconductor alloy material deposited in the centrally disposed plasma region to be etched away at a rate far greater than the rate at which semiconductor alloy material is deposited in that centrally disposed plasma region (the semiconductor alloy material is etched at a rate of at least 450 Å per minute).

In an effort to prevent the highly energetic plasma from entering the region between the horizontal plates 35a of the cathode shields 35 and the substrate 11, Applicants coated the surface of those horizontal plates 35a which faces the substrate 11 with the polyimide insulating coating 61 previously described. However, it was found that an electric current from electrons in the plasma was developed at the inner (closest to the central plasma region) edge of the polyimide coating, which current was responsible for drawing the plasma into the region between the plates 35a and the substrate 11. As the plasma was drawn into that region, a layer of silicon was deposited upon the Kapton coating 61, which silicon layer caused the coating 61 to lose its insulating function.

It is therefore a principle object of the present invention to (1) confine the highly energetic plasma, whether developed during the deposition of microcrystalline, p-doped semiconductor alloy material or during the deposition of amorphous material, to the central portion of the plasma region and (2) prevent that highly energetic plasma from creeping between the horizontal plates 35a (as well as any insulating coating disposed thereupon) of the cathode shields 35 and the web of substrate material 11.

BRIEF SUMMARY OF THE INVENTION

There is disclosed herein vapor deposition apparatus for depositing layers of semiconductor alloy material onto a substrate. The deposition apparatus comprises at least one dedicated deposition chamber which includes a substrate, a cathode spaced from the substrate, a gas inlet from which process gases are introduced into the plasma region formed between the substrate and the cathode, a generator for energizing the cathode to develop the plasma from the process gases introduced into the plasma region. The improvement in the vapor deposition apparatus comprises the addition of means adapted to substantially confine the plasma to at least one preselected portion of the plasma region. In this manner, only semiconductor alloy material deposited from at least one preselected portion of the plasma region is deposited onto the substrate. In one preferred embodiment, the confinement means may comprise a pair of spaced, biased elongated members. Each of the elongated members are operatively disposed adjacent the opposed distal ends of the plasma region, thereby confining the plasma to the central portion of the plasma region. In an alternate preferred embodiment, the biased members may be formed as part of the shields which define the longitudinal extent of the plasma regions. In any event, the bias is preferably d.c. and the biased members are adapted to quench the plasma in the vicinity thereof by repelling and thereby directing electrons from the plasma back toward the central portion of the plasma region. The biased members may have a plate-like configuration in which case they may have a surface thereof covered with an insulating coating to isolate the electrical bias thereupon from the remainder of the deposition assembly. Atop of the insulating coating a conductive material is affixed for supplying a preselected (negative) electrical bias which is again adapted to quench the plasma by repelling electrons. Finally, in those instances in which the vapor deposition apparatus is adapted for the continuous deposition of semiconductor alloy material upon an elongated web of substrate material, one of the biased members is disposed adjacent the leading edge of the cathode and the other of the biasing members is disposed adjacent the trailing edge of the cathode member.

Also disclosed in the instant application is a method of confining plasma within a plasma region which is formed in the space between a substrate and a cathode in a glow discharge deposition chamber. The method includes the steps of providing a source of process gases including at least one precursor semiconductor gas, introducing the process gases into the plasma region, energizing the cathode to form a plasma from the process gases flowing through the plasma region, and confining the plasma to at least one preselected portion of the plasma region. The method includes the further steps of using a negative d.c. bias to confine the plasma to the preselected portion of the plasma region by: providing a pair of spacedly disposed, elongated members, providing said electrical bias to each of the elongated members, and disposing the elongated members at opposed distal ends of the plasma region for confining the plasma to the central portion thereof. Finally, the method may be specifically adapted for the continuous deposition of semiconductor alloy material by the inclusion of the further steps of continuously moving the substrate through the deposition chamber, disposing one of the biased members at the leading edge of the cathode and disposing the other of the biased members at the trailing edge of the cathode. The biased members are further adapted to help ignite the plasma by supplying a flow electrons thereinto.

DETAILED DESCRIPTION OF THE DRAWINGS

I. The Photovoltaic Cell

Figure 1:
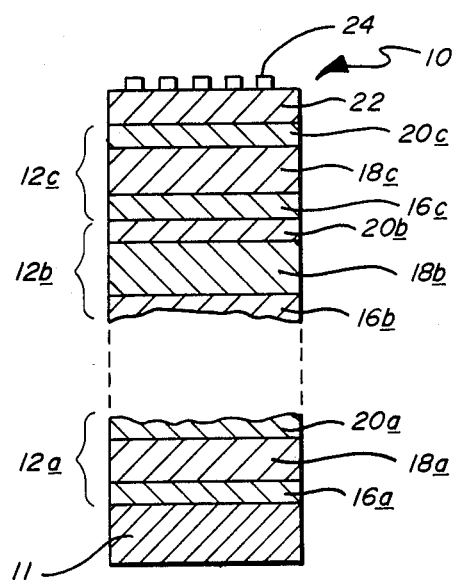
FIG. 1 is a fragmentary, cross-sectional view of a tandem photovoltaic device comprising a plurality of n-i-p type cells, each layer of the cells formed from a semiconductor alloy.

Referring now to the remainder of the drawings and particularly to FIG. 1, a photovoltaic cell, formed of a plurality of successive n-i-p layers, each layer of which includes, in the preferred embodiment, a substantially amorphous semiconductor alloy, is shown generally by the reference numeral 10. It is for the production of this type of photovoltaic device, wherein uniform, homogeneous, substantially amorphous semiconductor alloy layers are continuously deposited onto a substrate in successive isolated deposition chambers, that the plasma confinement apparatus of the present invention was developed. It is to be noted that the term "substantially amorphous', as used herein, is intended to refer to semiconductor alloy material which does not exhibit long range order and that term may include amorphous semiconductor alloy material having microcrystalline inclusions.

More particularly, FIG. 1 shows a n-i-p-type photovoltaic device, such as a solar cell, fabricated from a plurality of stacked, individual p-i-n-type cells, such as cells 12a, 12b and 12c. Below the lowermost cell 12a is a substrate 11 which may be transparent such as glass or plastic, or formed from a metallic material such as stainless steel, aluminum, tantalum, molybdenum or chrome. Although certain applications may require a thin oxide layer and/or a series of base contacts prior to the application of the substantially amorphous semiconductor alloy material, for purposes of this application, the term "substrate" shall include not only a flexible film, but also any elements added thereto by preliminary processing.

Each of the cells 12a, 12b and 12c are fabricated with a substantially amorphous alloy body containing at least a silicon alloy. Each of the alloy bodies includes an p-type conductivity region or layer 20a, 20b and 20c; an intrinsic region or layer 18a, 18b and 18c; and a n-type conductivity region or layer 16a, 16b and 16c. As illustrated, cell 12b is an intermediate cell and, as indicated in FIG. 1, additional intermediate cells may be stacked atop the illustrated cells without departing from the spirit or scope of the present invention. Also, although n-i-p cells are illustrated, the plasma confinement apparatus of this invention may also be used with apparatus adapted to produce single or multiple p-i-n cells.

It is to be understood that following the deposition of the layers of semiconductor alloy material, a further deposition process may be either performed in a separate environment or as a part of the continuous process. In this step, a TCO (transparent conductive oxide) layer 22, such as indium tin oxide, is deposited atop the exposed layer of semiconductor alloy material of the uppermost cell. Further, an electrode grid 24 may be added to the device where the cell is of sufficiently large surface area, or if the electrical conductivity of the TCO layer 22 is insufficient. The grid 24 shortens the carrier path and increases the photovoltaic conduction efficiency of the photovoltaic device 10.

II. The Multiple Glow Discharge Deposition Chambers

Figure 2:
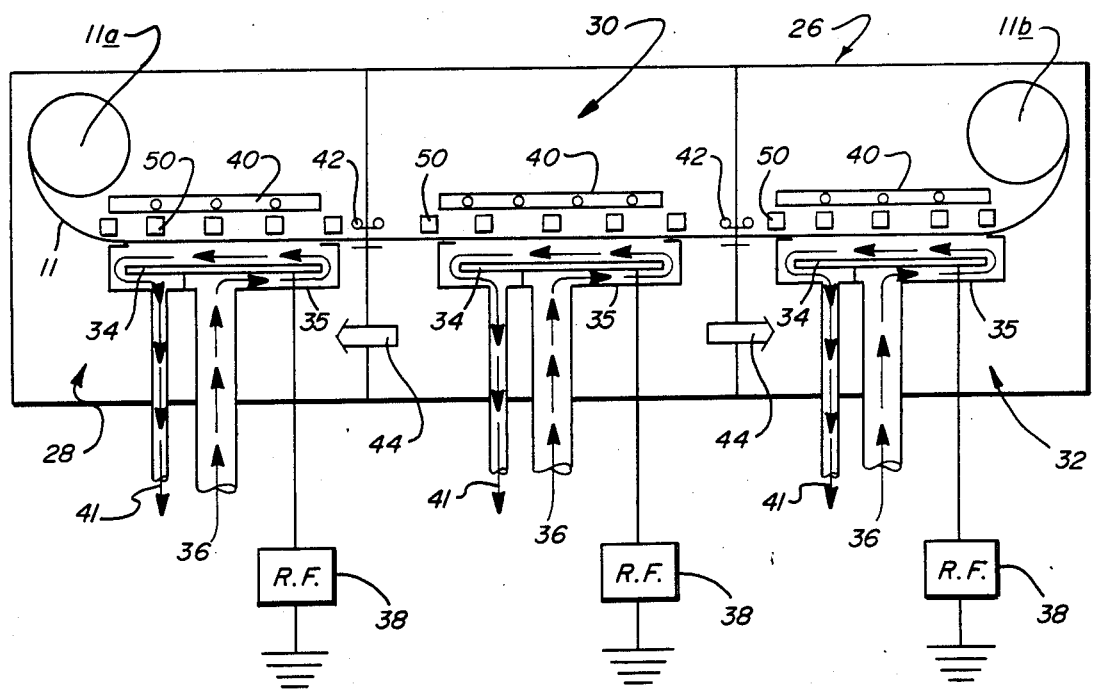
FIG. 2 is a diagrammatic representation of a multiple glow discharge chamber deposition system adapted for use in the continuous production of photovoltaic devices such as the cells shown in FIG. 1.

Turning now to FIG. 2, a diagrammatic representation of multiple glow discharge chamber deposition apparatus for the continuous production of semiconductor devices is generally illustrated by the reference numeral 26. The apparatus 26 includes a plurality of isolated, dedicated, glow discharge deposition chambers, each chamber of which is interconnected by a gas gate 42 through which (1) sweep gases, and (2) a web of substrate material 11 are adapted to pass.

The deposition apparatus 26 is adapted to continuously deposit n-i-p layers of substantially amorphous semiconductor alloy material onto the large area surface of the web of substrate material 11 which is continually fed therethrough. To deposit the layers of semiconductor alloy material required for producing multiple n-i-p type photovoltaic cells, the apparatus 26 includes at least one triad of deposition chambers. Each triad of deposition chambers comprises: a first deposition chamber 28 in which a layer of n-type conductivity semiconductr alloy material is deposited onto the deposition surface of the web of substrate material 11 as the web passes therethrough; a second deposition chamber 30 in which a layer of intrinsic semiconductor alloy material is deposited atop the n-type layer on the deposition surface of the web of substrate material 11 as the web 11 passes therethrough; and a third deposition chamber 32 in which a layer of p-type semiconductor alloy material is deposited atop the intrinsic layer on the deposition surface of the web of substrate material 11 as the web 11 passes therethrough.

It should be apparent that (1) although, only one triad of deposition chambers has abeen illustrated, additional triads or additional individual chambers may be added to the apparatus to provide the machine with the capability of producing semiconductor devices having any number of n-i-p type layers of semiconductor alloy material; (2) the plasma confining apparatus of the present invention is equally applicable to any production system which includes a substrate onto which a layer of semiconductor alloy material is deposited; (3) the substrate supply core 11a and the substrate take-up core 11b are shown in the deposition chambers for illustrative purposes only, while in reality the cores would be housed in separate chambers operatively connected to the deposition chambers; (4) although the glow discharge illustrated herein employs cathodes with r.f. power, other energy supplies, such as a.c. power generators, microwave generators and d.c. power generators, may be employed without departing from the spirit or scope of the present invention; and (5) the gaseous precursor sources of semiconductor alloy material may either be introduced to flow in a direction parallel but opposite to the direction of movement of the substate through the deposition chambers, or to be introduced into the plasma regions of the deposition chambers through the cathode plates themselves.

Each deposition chamber, 28, 30 and 32 of the triad is adapted to deposit a single layer of semiconductor alloy material, by glow discharge deposition, onto the electrically conductive web of substrate material 11. To that end, each of the deposition chambers 28, 30 and 32 includes: a cathode plate 34; a gas confinement shield (a cathode shield) 35 disposed about each of the cathodes 34; a process gas supply conduit 36; a radio frequency generator or other a.c. or d.c. power source 38; a process gas and plasma evacuation conduit 41; a plurality of transversely extending magnetic elements 50; a plurality of radiant heating elements shown schematically as 40 in FIG. 2; and a gas gate 42 operatively interconnecting the intrinsic deposition chamber to each of the adjacent dopant deposition chambers. Additionally, a flow of isolation gas is provided to maintain the gaseous environment of the intrinsic deposition chamber 30 free of gaseous contaminants from the interior atmospheres of the discrete dopant deposition chambers 28 and 32.

The supply conduits 36 are operatively associated with the respective cathode plates 34 or other decomposition mechanisms to deliver process gas mixtures to the plasma regions created in each deposition chamber between said decomposition mechanism and the web of substrate material 11. The cathode shields 35 are adapted to operate in conjunction with the web of substrate material 11 and the evacuation conduit 41 to substantially confine the mixture of process gases within the cathode region of the deposition chambers.

The radio frequency or other similar type of power generators 38 operate in conjunction with the cathode plate 34, the radiant heaters 40 and the grounded web of substrate material 11 to form the plasma by disassociating and recombining the elemental reaction gases entering the deposition chambers into highly reactive deposition species and compounds. These activated species and compounds are then deposited onto the bottom surface of the web of substrate material 11 as uniform and homogeneous layers of semiconductor alloy material. The web of substrate material 11 is maintained substantially flat by the plurality of rows of magnetic elements 50 which provide an attractive force urging the web of substrate material 11 upwardly, out of its normal sagging path of travel.

To form the type of photovoltaic cell 10 illustrated in FIG. 1, a layer of n-type, substantially amorphous (and preferably microcrystalline) semiconductor alloy material is deposited onto the web of substrate material 11 in the n-dopant deposition chamber 28, a layer of intrinsic substantially amorphous semiconductor alloy material is deposited atop the p-type layer in the intrinsic deposition chamber 30 and a layer of p-type substantially amorphous (and preferably microcrystalline) semiconductor alloy material is deposited atop the intrinsic layer in the p-dopant deposition chamber 32. As a result, in the preferred embodiment, the apparatus 26 is adapted to successively deposit at least three substantially amorphous layers of semiconductor alloy material onto the web of substrate material 11 with the intrinsic layer deposited in deposition chamber 30 differing in composition from the layers deposited in deposition chambers 28 and 32 by the absence of at least one element which will be referred to hereinafter as the dopant or doping species.

It is important that each of the layers of semiconductor alloy material be uniformly and homogeneously deposited across the entire large area surface of the web of substrate material 11. Therefore, each layer of the deposited semiconductor alloy material must be deposited from specific activated species and compounds of the mixture of precursor process gases which have been subjected to a uniform electromagnetic field for substantially identical lengths of time. Only in this manner, is it possible for layers of semiconductor alloy material which possess uniform compositional and bonding characteristics and which exhibit a uniform, homogeneous range of optical, electrical, and chemical properties across the entire surface of the web of substrate material 11 to be deposited. It is to the end of satisfying the above criteria of uniformity and homogeneity that the plasma confining apparatus of the instant invention is directed.

III. The Plasma Confining Apparatus

Figure 5:
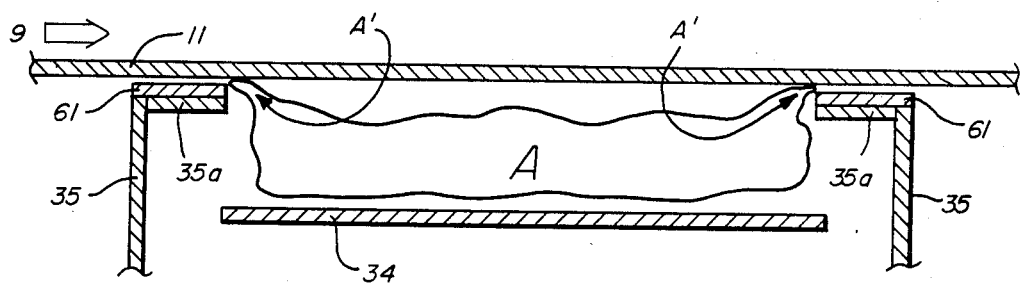
FIG. 5 is an enlarged, schematic representation illustrating the manner in which a highly energetic plasma tends to "creep" into the space between the cathode shielding plates and the substrate and etch away previously deposited semiconductor alloy material.

As described in the Background of the Invention section of the instant patent application, and with specific reference to FIG. 5, in the high powered deposition of semiconductor alloy material (such as the fluorinated, microcrystalline, p-doped, semiconductor alloy material), the increased power density causes the development of a more highly energized plasma. Such an activated plasma, being highly energetic, is able to creep into the "forbidden" space between the cathode shields (also referred to as process gas confinement shielding) 35 and the web of substrate material 11. The result of this plasma creeping is the rapid etching away of previously deposited semiconductor alloy material.

Figure 6:
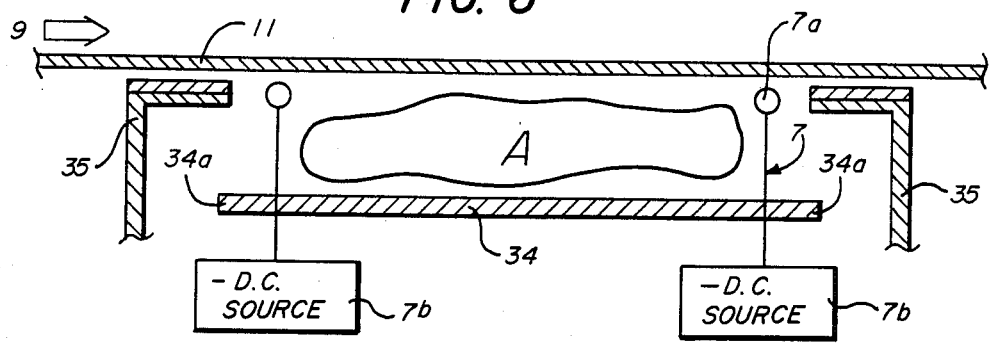
FIG. 6 is an enlarged, schematic representation illustrating one manner in which the highly energetic, ionized plasma of FIG. 5 may be restricted to a centralized portion of the plasma region by the confining apparatus of the instant application.

Turning now specifically to FIG. 6, a first embodiment of the plasma confining apparatus of the instant invention is illustrated generally by the reference numeral 7. Applicants, when confronted with the etching problem described in the preceding paragraphs decided to transversely dispose (relative to the direction of substrate movement) an elongated member such as tube 7a adjacent each of the opposed distal ends of the central plasma region A (i.e., adjacent to, but spaced upwardly of, the leading edge and the trailing edge of the cathode plate 34).

Each of the elongated members 7a is operatively coupled to a negative d.c. biasing voltage of about 200 volts from one or more sources of d.c. power 7b. The length of each of the elongated members 7a is selected so as to be substantially coextensive with the width dimension of the cathode plate 34 disposed therebelow. In this manner, the negatively biased members 7a not only quench (i.e., operate to repel the the negatively charged electrons of the activated plasma and confine the plasma to the central portion of the region of ionized plasma A) thereby preventing leakage past the cathode shields 35, but the members 7a also inject electrons into the process gas mixture to help ignite the plasma.

Figure 3:
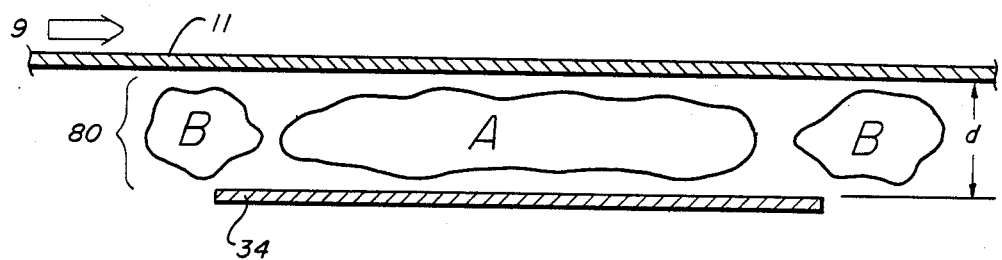
FIG. 3 is an enlarged, schematic representation of the nonuniform, nonhomogeneous electromagnetic fields developed in the plasma region of a glow discharge deposition chamber which is not equipped with shielding plates.
Figure 4:
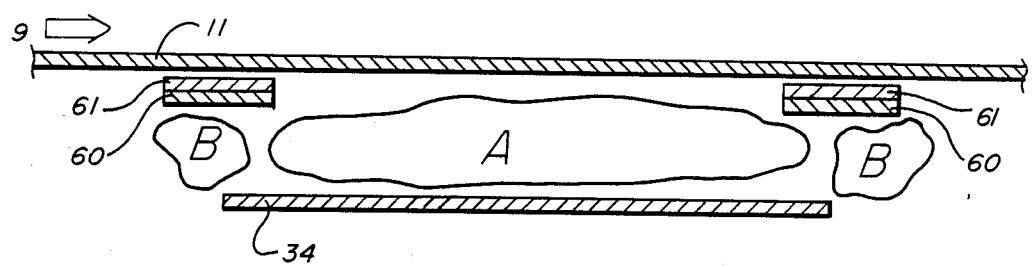
FIG. 4 is an enlarged, schematic representation illustrating the manner in which shielding plates may be operatively positioned to substantially prevent nonuniform, nonhomogeneous from being deposited onto the substrate.

Note that while the plasma confining apparatus 7 of the instant invention has been described for operative disposition adjacent the opposed distal ends 34a of the cathode plate 34 in a p-dopant glow discharge deposition chamber, the plasma confining apparatus 7 may be, and preferably is, also operatively disposed adjacent the distal ends 34a of the cathode plate(s) 34 in the intrinsic and the n-dopant glow discharge deposition chambers. When so employed, the plasma confining apparatus 7 may be substituted for the shielding plates 60 because the activated plasma formed by those portions of the plasma region having nonuniform, nonhomogeneous electromagnetic fields (portions B of FIGS. 3–4) are quenched and the ionized plasma is restricted to the central portion A of the plasma region. Further, since the activated plasma is restricted to the central portion A of the plasma region, said plasma cannot creep into the forbidden spaces between the cathode shields 35 and the web of substrate material 11 to etch or otherwise contaminante previously deposited semiconductor alloy material.

Figure 7:
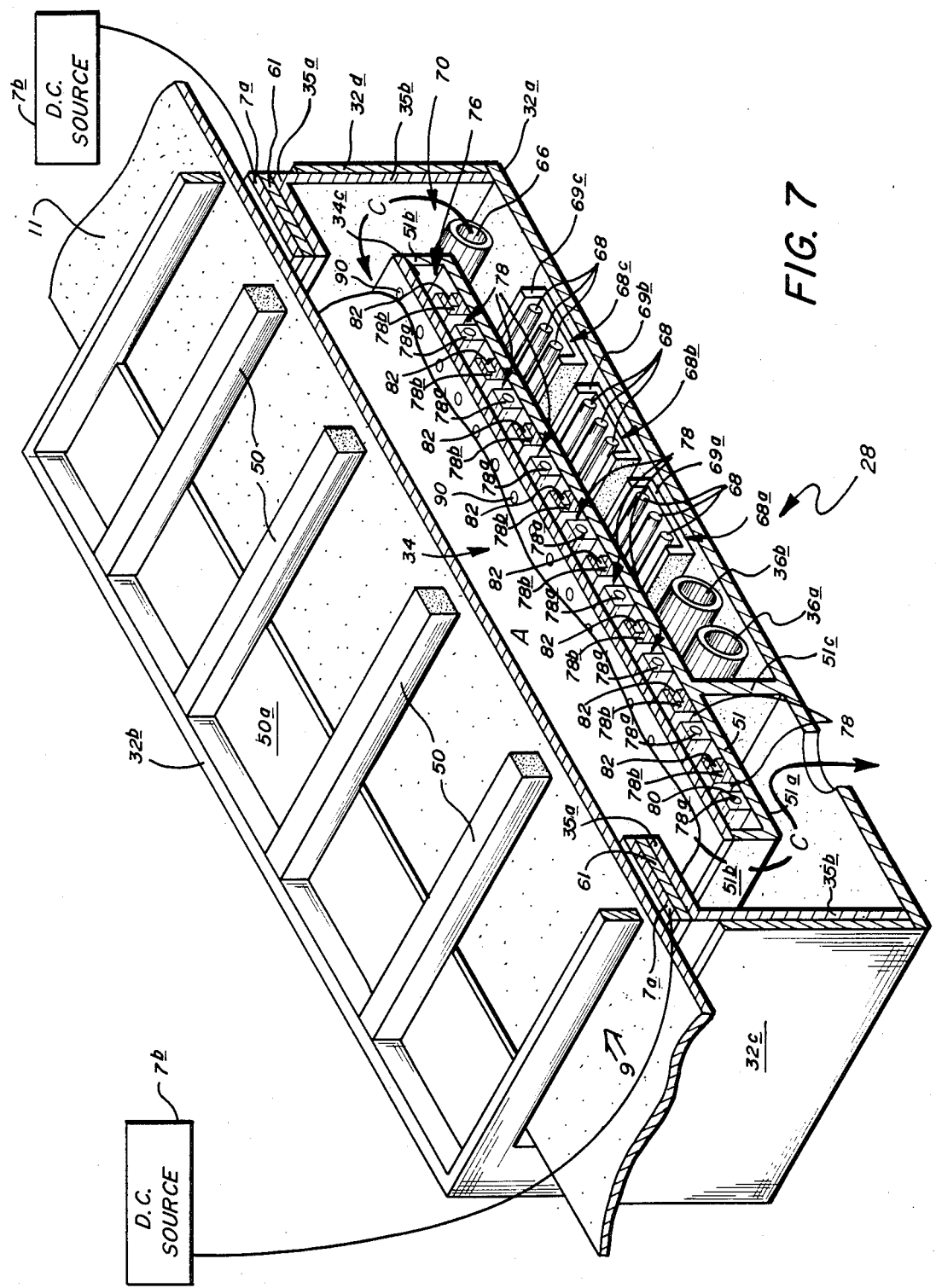
FIG. 7 is an enlarged, fragmentary prerspective view, partially in cross-section, illustrating a second embodiment of the plasma confining apparatus of the instant invention, as that apparatus is operatively disposed within a glow discharge deposition chamber.

Referring now to a more detailed depiction of the type of glow discharge cathode assembly referred to hereinabove, and fully illustrated in FIG. 7; said assembly will be generally referenced by the numeral 70. The cathode assembly 70 is operably disposed in a deposition chamber which for the purposes of this discussion has been arbitrarily selected as the p-dopant deposition chamber 32. The exemplary cathode assembly 70 illustrated in FIGS. 7 is structured so as to have, in the primary embodiment, the capability of introducing the doped additional gaseous precursor material from the introductory manifold assemblies 78 into any specific, localized area of the plasma region. This cathode assembly has been fully described in U.S. patent application Ser. No. 664,453, filed Nov. 24, 1984, and assigned to the Assignee of the instant application, the disclosure of which being incorporated herein by reference.

Throughout the description of the first preferred embodiment which follows, it is important to remember that the direction of flow of the gaseous semiconductor alloy precursor material through the decomposition region of the deposition chamber 32 is depicted by the reference arrow C, while the direction of travel of the web of substrate material 11 therethrough is depicted by the reference arrow 9. The flow of the gaseous precursor semiconductor material is, therefore, substantially parallel to the direction of movement of the web of substrate material 11 through the plasma region of the deposition chamber 32. After providing for such parallel flow, the secondary gaseous precursor materials may be introduced into the decomposition region of the particular deposition apparatus in only localized areas so as to provide for the deposition of a uniform layer of those secondary gaseous precursor materials in the host matrix of the primary gaseous precursor material.

While, as noted in the preceding paragraph, the introductory flow of the gaseous semiconductor alloy precursor material through the decomposition region of a deposition chamber is substantially parallel to tne movement of the web of substrate material 11 therethrough, in a second preferred embodiment, the gaseous semiconductor alloy precursor material is introduced into the decomposition region of the deposition chamber through the apertured cathode plate, described hereinafter. By utilizing an introductory flow of the gaseous semiconductor alloy material through the apertured cathode plate, (1) said gaseous semiconductor alloy precursor material will not be depleted in the plasma region, (2) adjacent sections of the plasma region can be tailored (profiled) to contain precisely selected percentages of gaseous precursor materials, and (3) the length of the cathode plate, even the cathode plate in the intrinsic deposition chamber, does not interfere with the introduction of precisely selected percentages of the gaseous precursor dopant material.

The deposition chamber 32 is generally a rectangularly-shaped, box-like member which includes a bottom wall 32a, a top wall 32b, side walls 32c and 32d, and a back wall not shown. Disposed interiorly of the deposition chamber 32 and approximately midway between the upper wall 32b and the lower wall 32a, is the cathode assembly 70. The cathode assembly 70 includes a cathode plate 34 adpated to receive r.f. power from the power source 38 (see FIG. 2) for generating an ionized plasma from the gaseous precursor materials adapted to flow between said cathode plate 34 and the moving web of substrate material 11. The web of substrate material 11 is adapted to enter the deposition chamber 32 from a downstream substrate entry port (downstream relative to the flow of gaseous precursor semiconductor alloy material through the decomposition region) and exit from the deposition chamber 32 through an upstream substrate exit port. In this manner, the web of substrate material 11 travels through the exit and entry ports of the deposition chamber 32 just above the generally horizontally disposed shoulders 35a which are formed at the upper extent of generally vertically disposed legs 35b of the shields 35. The vertical legs 35b are securely fastened to the side walls 32c and 32d, respectively, of the deposition chamber 32.

The deposition chamber 32 includes a gaseous precursor semiconductor alloy material supply manifold 36a which is adapted to introduce, for instance, the intrinsic semiconductor alloy material into the deposition chamber 32 and a secondary supply manifold 36b which is adapted to introduce a secondary gaseous intrinsic semiconductor alloy material into the deposition chamber 32. The supply manifolds 36a and 36b are both elongated, transversely extending, tubular members having apertures spaced along the full length thereof so as to uniformly introduce the respective primary and secondary gaseous precursor materials into the deposition chamber across the entire width of the web of substrate material 11. Consequently, the primary and secondary gaseous precursor semiconductor alloy materials are introduced into the decomposition region along the entire transverse width of the area of the deposition chamber 32 in which an activated plasma is to be developed.

The process gas introduction and channeling system is formed by gas directing shielding 51 which extends across the width of the deposition chamber 32 and which has a generally horizontally disposed base support member 51a and longitudinally spaced, generally vertically disposed and upwardly extending cathode supporting legs 51b. The cathode supporting legs 51b are adapted to closely abut, in leak-tight fashion, the bottom surface 34c of the cathode plate 34. In order to insure that all additional gaseous precursor materials introduced into the compartment 76 formed between the cathode plate 34 and the base support member 51a of the gas directing shielding 51 can be subsequently introduced into the plasma region only through the apertures 90 formed through the cathode plate 34, the junction formed between the upright legs 51b of the shielding 51 and the bottom surface 34c of the cathode plate 34 is adapted to prevent the leakage of gaseous precursor material therepast. The gas directing shielding 51 further includes a generally vertically oriented leg 51c adapted to (1) support the horizontal support member 51a above the surface of the bottom wall 32a of the deposition chamber 32 for the purposes described hereinafter, and (2) divide the bottom portion of the deposition chamber 32 into gas introductory and gas exhaust segments. The vertical leg 51c is formed to be generally coextensive with the width of the cathode plate 34 so as to fully isolate the introduction of gaseous precursor materials into the plasma region from the exhaust of those nondeposited gaseous precursor materials from the plasma region.

Further note that a precathode assembly such as electrically-conductive rod 66, may be disposed downstream of the gaseous precursor semiconductor alloy introductory manifolds 36a and 36b. The precathode rod 66 is adapted to begin the initial disassociation and recombination of gaseous precursor material flowing therepast, as well as forming part of the system which collects impurities from the gaseous precursor material and contaminants from the walls of the deposition chamber 32 so as to prevent the contaminants and impurities from being deposited along with the semiconductor alloy material onto the web of substrate material 11. Note that the use of such an upstream cathode assembly has been fully described in U.S. patent application Ser. No. 475,289 filed Mar. 14, 1983, assigned to the assignee of the instant application, and need not be further detailed herein.

A plurality of substantially equally spaced banks 68a-68c of heating elements, generally 68, are also provided. Each of the banks 68a-68c includes a heat reflective shield 69a-69c, respectively, to direct the heat from the heating elements 68 toward the introduced gaseous precursor material and the cathode assembly 70 operatively disposed thereabove. The number and spacing of the banks of heating elements 68a-68c, as well as the number and spacing of the individual heating elements 68 in each bank should be sufficient to prewarm the gaseous precursor materials flowing therepast to a predetermined temperature. Although not illustrated in FIG. 7, another array of heating elements, schematically depicted in FIG. 2 by the reference numeral 40, is disposed above the plurality of elongated, spaced, ceramic bar magnets 50, which magnets 50 are supported across the width of the deposition chamber 32 atop oppositely disposed and longitudinally extending magnet support shelves 50a, only the rear one of which is illustrated. The upper array of heating elements 40 are adapted to warm the web of substrate material 11 to the predetermined deposition temperature, while the bar magnets 50 are adpated to urge the magnetic web of substrate material 11 upwardly, into sliding contact therewith.

Referring now to the specific construction of the cathode assembly 70, it should be noted that the additional gaseous precursor material introductory compartment 76 is bounded by the spaced upright legs 51b, the bottom support member 51a of the gas confining shield 51 and the botton surface 34c of the cathode plate 34 so as to define an enclosure only about ⅛ inch in height. It is within this compartment 76 that the first and second additional gaseous precursor materials as well as third and fourth gaseous precursor materials may be introduced and fed through the approximately 1/32 inch diameter apertures 90 of the cathode plate 34 (the apertures may preferably form about 30% of the cathode plate) into specific localized areas of the plasma region of the deposition chamber 32.

Operatively disposed within the compartment 76 are a plurality of additional gaseous precursor introduction manifold assemblies generally referred to by the reference numeral 78. Each of the manifold assemblies 78 includes adjacent gas receiving manifolds 78a and gas delivery manifolds 78b interconnected by a relatively small diameter capillary tube (not shown), said tubes having an inner diameter of about 10 mils and being about ½ inch in length.

Each of the gas receiving and the gas delivery manifolds 78a and 78b, respectively, are generally rectangularly shaped members extending transversely across the entire width of the cathode plate 34. Each gas receiving manifold 78a includes a central bore 80, approximately 1/16 inch in diameter, extending along the entire longitudinal length thereof and hence extending across the entire transverse width of the cathode plate 34. The gas delivery manifold 78b includes a plurality of spaced, generally rectangularly shaped slots 82, the front face of each of which is open so as to feed additional gaseous precursor materials therefrom into the compartment 76. The front faces are preferably disposed so as to initially direct the additional gaseous precursor material emanating therefrom in a sideward direction for preselected localized introduction into only at least localized areas of the plasma region of the deposition chamber 32. It is important to note that because the pressure within the introductory compartment 76 is substantially equal to the pressure within the plasma region and the height of the compartment 76 is only about ⅛ inch, almost all of the additional gaseous precursor materials emanating from any given gas delivery manifold will be introduced through the apertures 90 most directly above the sub-compartments from which said materials enter the introductory compartment 76. In this manner, the particular gaseous precursor mixtures introduced into any given sub-compartment are not able to diffuse into adjacent sub-compartments, thereby providing for the introduction of particular gaseous precursor mixtures into only preselected localized areas of the plasma region.

FIG. 7 illustrates a second preferred embodiment of the plasma confining apparatus 7 of the instant invention, which apparatus is specifically designed to be operatively disposed within the glow discharge deposition chamber 32 for restricting the highly energetic plasma A to the central portion of the plasma region in a continuous deposition environment. In order to best accommodate the existing structure of the glow discharge deposition chamber 32, the plasma confining apparatus 7 is designed so as to be part of the horizontal shoulders 35a of the confining shields 35 disposed at the opposed distal ends (the leading and the trailing end) of the cathode plate 34. More particularly, elongated, horizontally disposed plates 35a have the upper surfaces thereof coated with a layer of an electrically insulating material 61 such as KAPTON (a registered trademark of the Dupont Corporation). Atop of the KAPTON layer 61 of each of the plates 35a an electrically conductive biasing member 7a is affixed. Each of the plates 35a is then coupled to a source of negative d.c. current 7b, from which a negative d.c. bias delivered to the biasing members 7a operates to quench the highly energetic plasma in the immediate vicinity of those members (in precisely the same manner as previously desribed with reference to the elongated members 7a of FIG. 6). Since the negative bias prevents the creep of the plasma into the space between the shielding plates 35a and the web of substrate material 11, the previously deposited uniform and homogeneous semiconductor alloy material is not etched away.

While the plasma confining apparatus of the instant invention has been described as restricting the ionized plasma to the central portion of a plasma region, note that the addition of further biasing members could be used to restrict the ionized plasma to any preselected portion, to any plurality of portions, or to any particularly shaped portion of the plasma region without departing from the spirit a scope of the subject invention.

It should be understood that the present invention is not limited to the precise structsure of the illustrated embodiments. It is intended that the foregoing description of the presently preferred embodiments be regarded as an illustration rather than as a limitation of the present invention. It is the claims which follow, including all equivalents, which are intended to define the scope of this invention.

What we claim is:

1. In plasma glow discharge deposition apparatus wherein layers of semiconductor alloy material are deposited onto a substrate, the deposition apparatus comprising at least one dedicated deposition chamber which includes: means for supporting a substrate; cathode means spaced from the substrate; means for introducing process gases in a plasma region formed between the substrate and the cathode means; and a power source for energizing the cathode means to develop an activated plasma from the process gases introduced into the plasma region for facilitating the reaction thereof, the improvement comprising, in combination:

electrically biased means adapted to repel plasma electrons so as to substantially confine the plasma to at least one preselected portion of the plasma region, whereby only semiconductor alloy material deposited from said at least one preselected portion of the plasma region is deposited onto the substrate.

2. Apparatus as in claim 1, wherein the electrically biased means comprise a pair of spaced biasing members.

3. Apparatus as in claim 2, wherein each of the biasing members are operatively disposed adjacent the opposed distal ends of the plasma region, whereby the plasma is confined to the central portion of the plasma region.

4. Apparatus as in claim 3, wherein each of the biasing members is an elongated member connected to a negative d.c. bias, said biasing member adapted to quench the plasma in the vicinity thereof.

5. Apparatus as in claim 4, wherein the biasing members are a pair of plates disposed adjacent to but spaced from the substrate.

6. Apparatus as in claim 5, wherein the biased plates have a surface thereof covered with an insulator to insulate the electrical bias on the plates from the remainder of the deposition assembly.

7. Apparatus as in claim 3, wherein the vapor deposition apparatus is adapted for the continuous deposition of semiconductor alloy material upon an elongated web of substrate material; means are provided for continuously advancing the web of substrate material through the deposition chamber; and one of said biasing members is disposed adjacent the leading edge of the cathode means and the other of said biasing members is disposed adjacent the trailing edge of the cathode means.

8. A method of confining a highly energetic plasma within the plasma region formed in the space between a substrate and a cathode means in a glow discharge deposition chamber; the method including the steps of:
   providing a source of process gases including at least one precursor semiconductor gas;
   introducing the process gases into the plasma region;
   energizing the cathode means to form an activated plasma from the process gases flowing through the plasma region for facilitating the reaction thereof; and,
   providing electrically biased means adapted to repel plasma electrons so as to confine the activated plasma to a preselected portion of the plasma region, whereby only semiconductor alloy material from said preselected portion of the plasma region is deposited onto the substrate.

9. A method as in claim 8, including the further steps of: providing a pair of spacedly disposed, elongated members; and providing a negative d.c. bias to each of the elongated numbers.

10. A method as in claim 9, including the further step of disposing the elongated members at opposed distal ends of the plasma region for confining the ionized plasma to the central portion thereof.

11. A method as in claim 10, including the further steps of:
   continuously moving the substrate through the deposition chamber;
   disposing one of said elongated members at the leading edge of the cathode means; and
   disposing the other of said elongated members at the trailing edge of the cathode means.

* * * * *